United States Patent
Im et al.

(10) Patent No.: US 7,579,904 B2
(45) Date of Patent: Aug. 25, 2009

(54) SEMICONDUCTOR MEMORY DEVICE

(75) Inventors: Jae-Hyuk Im, Icheon-si (KR); Jae-Jin Lee, Icheon-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 11/623,569

(22) Filed: Jan. 16, 2007

(65) Prior Publication Data

US 2007/0115746 A1  May 24, 2007

Related U.S. Application Data

(63) Continuation of application No. 10/982,165, filed on Nov. 5, 2004, now abandoned.

(30) Foreign Application Priority Data

Apr. 12, 2004  (KR)  ............... 2004-25060

(51) Int. Cl.
G05F 1/10  (2006.01)
(52) U.S. Cl. .................. 327/540; 365/226
(58) Field of Classification Search ........... 327/530, 327/538, 540–543; 365/226, 228, 229
See application file for complete search history.

(56) References Cited

U.S. PATENT DOCUMENTS

| | | | | |
|---|---|---|---|---|
| 5,337,282 A * | 8/1994 | Koike | ............... | 365/201 |
| 5,349,559 A * | 9/1994 | Park et al. | ............... | 365/201 |
| 5,747,974 A | 5/1998 | Jeon | | |
| 5,973,484 A | 10/1999 | Cho | | |
| 5,973,963 A | 10/1999 | Sugawara | ............... | 365/185.23 |
| 6,058,061 A | 5/2000 | Ooishi | | |
| 6,111,457 A | 8/2000 | Lim et al. | | |
| 6,122,211 A | 9/2000 | Morgan et al. | ......... | 365/189.16 |
| 6,229,343 B1 * | 5/2001 | Bauer et al. | ............... | 326/104 |
| 6,249,473 B1 * | 6/2001 | Lau et al. | ............... | 365/227 |
| 6,292,424 B1 | 9/2001 | Ohsawa | ............... | 365/226 |
| 6,326,837 B1 * | 12/2001 | Matano | ............... | 327/545 |
| 6,335,884 B1 | 1/2002 | Kajigaya et al. | | |
| 6,339,357 B1 | 1/2002 | Yamasaki et al. | | |
| 6,426,908 B1 * | 7/2002 | Hidaka | ............... | 365/222 |
| 6,532,167 B2 * | 3/2003 | Kaneko et al. | ............... | 365/149 |
| 6,574,150 B2 | 6/2003 | Suyama et al. | | |
| 6,721,223 B2 * | 4/2004 | Matsumoto et al. | ......... | 365/222 |
| 6,781,443 B2 | 8/2004 | Hamamoto et al. | | |
| 6,809,576 B1 * | 10/2004 | Yamasaki | ............... | 327/540 |
| 6,903,994 B1 * | 6/2005 | Schoenfeld | ............... | 365/227 |

(Continued)

*Primary Examiner*—Lincoln Donovan
*Assistant Examiner*—Thomas J Hiltunen
(74) *Attorney, Agent, or Firm*—Marshall, Gerstein & Borun LLP

(57) ABSTRACT

Disclosed herein is an internal voltage generation circuit of a semiconductor memory device which is capable of supplying voltages of different levels to a column path & control logic and data path & control logic in the memory device according to different operation modes of the memory device. The column path & control logic and data path & control logic are applied with a normal operating voltage when they are involved in the current operation mode of the memory device, whereas with a lower voltage when they are not involved. Therefore, the present invention has the effect of efficiently managing internal voltages of the semiconductor memory device and reducing current leakage of the memory device and, in turn, unnecessary power consumption thereof.

4 Claims, 7 Drawing Sheets

U.S. PATENT DOCUMENTS

| | | |
|---|---|---|
| 6,922,369 B2 * | 7/2005 | Kim ............................ 365/222 |
| 7,173,870 B2 * | 2/2007 | Lee ............................ 365/222 |
| 2002/0136067 A1 | 9/2002 | Kojima ....................... 365/200 |
| 2004/0004513 A1 | 1/2004 | Rhee et al. .................. 357/540 |
| 2005/0225379 A1 | 10/2005 | Im et al. |

* cited by examiner

SEMICONDUCTOR MEMORY DEVICE

CROSS-REFERENCE TO RELATED APPLICATIONS

This patent is a continuation of U.S. Ser. No. 10/982,165 filed Nov. 5, 2004, now abandoned, which claims priority to Korean Patent Application No. 2004-0025060 filed on Apr. 12, 2004, the disclosures of which are hereby expressly incorporated for all purposes.

FIELD OF THE INVENTION

The present invention relates to an internal voltage generation circuit of a semiconductor memory device, and more particularly to an internal voltage generation circuit for supplying voltages of different levels to a specific area in a semiconductor memory device according to whether the specific area is involved in the current operation mode of the memory device, so as to reduce current leakage and power consumption of the memory device.

DESCRIPTION OF THE RELATED ART

FIG. 1 is a general conceptual diagram of a semiconductor memory device. As shown in this drawing, the semiconductor memory device basically comprises a cell array, a row path & control logic 11, a column path & control logic 15, and a data path & control logic 14. Among these, the row path & control logic 11, the column path & control logic 15 and the data path & control logic 14 are typically called a peri area in the gross.

FIG. 2 is a conceptual diagram of an internal voltage generation circuit of a conventional semiconductor memory device. As shown in this drawing, if an external voltage Vcc is applied to the memory device, then internal voltages necessary for the operation of the memory device are internally generated in the memory device. These internal voltages may be, for example, a high voltage Vpp to a word line, a voltage Vcore to a cell and bit line sense amplifier, a high voltage source Vperi to a peri area, etc.

In the conventional memory device, once the internally generated voltage Vperi is determined in level, it is applied in common to all components in the peri area. That is, once being generated, the voltage Vperi of the same level is applied to all of a row path & control logic, column path & control logic and data path & control logic in the peri area.

Recently, in a semiconductor memory device, the external voltage Vcc has gradually become lower in level as the memory device has become higher in speed and lower in power. As a result, the internal voltages for the internal operation of the memory device have become lower in level, too, resulting in there being a need to reduce a threshold voltage Vt of a transistor so as to secure the operation margin of the memory device. However, as the threshold voltage has become lower in level, the memory device has increased in current leakage and, in turn, in power consumption. For this reason, there has been a need to reduce the current leakage resulting from the fact that the external voltage Vcc is lower in level.

However, in the conventional semiconductor memory device, as mentioned above, the voltage of the same level is supplied to the entire pen area irrespective of the operation mode of the memory device, thereby making it impossible to control the voltage level based on the operation mode of the memory device. For this reason, there is no room to reduce power consumption of the memory device by preventing unnecessary current leakage thereof.

In detail, in a semiconductor memory device, when the memory device is in an active mode, all components of a pen area are involved in the active mode. However, when the memory device is in a standby mode including a refresh mode, only a row path & control logic in the peri area is involved in the standby mode, but the other components in the peri area, or a column path & control logic and a data path & control logic, are not involved therein. Accordingly, in order to reduce unnecessary current leakage of the memory device, it is required to supply a voltage of a desired level to only the involved components and a voltage of a lower level to the other components, respectively. However, the conventional semiconductor memory device is designed to supply the voltage of the same level to the entire peri area regardless of the operation mode thereof, resulting in inevitable occurrence of unnecessary current leakage as mentioned above.

SUMMARY OF THE INVENTION

Therefore, the present invention has been made in view of the above problems, and it is an object of the present invention to provide an internal voltage generation circuit of a semiconductor memory device which is capable of, according to the current operation mode of the memory device, supplying a voltage of a desired level to components in a peri area, involved in the operation mode, and a voltage of a lower level to the other components in the peri area, not involved in the operation mode, respectively, thereby reducing current leakage and power consumption of the memory device.

In accordance with an aspect of the present invention, the above and other objects can be accomplished by the provision of an internal voltage generation circuit of a semiconductor memory device comprising: reference voltage generation means for generating a reference voltage as a control signal for internal voltage supply, first internal voltage generation means for generating a first internal voltage of a desire level in response to the reference voltage from the reference voltage generation means; and second internal voltage generation means responsive to an enable signal resulting from a logical operation of an active control signal indicative of an active mode and a refresh control signal indicative of a refresh mode and the reference voltage from the reference voltage generation means, for generating a second internal voltage of the same level as that of the first internal voltage when the memory device is in the active mode and a third internal voltage of a level lower than that of the first internal voltage when the memory device is in any other mode including the refresh mode.

Preferably, the first internal voltage is supplied to a row path & control logic in the memory device and the second and third internal voltages are supplied to a column path & control logic and a data path & control logic in the memory device.

Preferably, the first internal voltage generation means includes: current mirror amplification means for comparing the first internal voltage with the reference voltage to obtain a difference therebetween and amplifying the obtained difference; and pull-up means for raising the level of the first internal voltage to that of the reference voltage if it becomes lower than the level of the reference voltage.

Preferably, the second internal voltage generation means includes: current mirror amplification means responsive to the enable signal for, only when the memory device is in the active mode, comparing the second internal voltage with the reference voltage to obtain a difference therebetween and amplifying the obtained difference; pull-up means for raising the level of the second internal voltage to that of the reference voltage if it becomes lower than the level of the reference voltage; and a MOS (Metal-Oxide Semiconductor) diode for generating the third internal voltage of the level lower than that of the first internal voltage at an output terminal of the second internal voltage generation means when the memory device is in any other mode including the refresh mode.

The first internal voltage generation means may include: first current mirror amplification means for comparing the first internal voltage with the reference voltage to obtain a difference therebetween and amplifying the obtained difference; and first pull-up means for raising the level of the first internal voltage to that of the reference voltage if it becomes lower than the level of the reference voltage; and the second internal voltage generation means may include: second current mirror amplification means responsive to the enable signal for, only when the memory device is in the active mode, comparing the second internal voltage with the reference voltage to obtain a difference therebetween and amplifying the obtained difference; second pull-up means for raising the level of the second internal voltage to that of the reference voltage if it becomes lower than the level of the reference voltage; and a MOS diode for generating the third internal voltage of the level lower than that of the first internal voltage at an output terminal of the second internal voltage generation means when the memory device is in any other mode including the refresh mode.

In accordance with another aspect of the present invention, there is provided an internal voltage generation circuit of a semiconductor memory device comprising: reference voltage generation means for generating a first reference voltage and a second reference voltage as control signals for internal voltage supply, first internal voltage generation means for generating a first internal voltage of a desired level in response to the first reference voltage from the reference voltage generation means; reference voltage transfer means responsive to an enable signal resulting from a logical operation of an active control signal indicative of an active mode and a refresh control signal indicative of a refresh mode and the first and second reference voltages from the reference voltage generation means, for transferring the first reference voltage when the memory device is in the active mode and the second reference voltage when the memory device is in any other mode including the refresh mode; and second intern voltage generation means responsive to an output voltage from the reference voltage transfer means for generating a second internal voltage of the same level as that of the first internal voltage if the output voltage is the first reference voltage and a third internal voltage of a level lower than that of the first internal voltage if the output voltage is the second reference voltage.

Preferably, the first internal voltage is supplied to a row path & control logic in the memory device and the second and third internal voltages are supplied to a column path & control logic and a data path & control logic in the memory device.

Preferably, the first internal voltage generation means includes: current mirror amplification means for comparing the first internal voltage with the first reference voltage to obtain a difference therebetween and amplifying the obtained difference; and pull-up means for raising the level of the first internal voltage to that of the first reference voltage if it becomes lower than the level of the first reference voltage.

Preferably, the second internal voltage generation means includes: current mirror amplification means for comparing the second (or third) internal voltage with the first (or second) reference voltage to obtain a difference therebetween and amplifying the obtained difference; and pull-up means for raising the level of the second (or third) internal voltage to that of the first (or second) reference voltage if it becomes lower than the level of the first (or second) reference voltage.

The first internal voltage generation means may include: first current mirror amplification means for comparing the first internal voltage with the first reference voltage to obtain a difference therebetween and amplifying the obtained difference; and first pull-up means for raising the level of the first internal voltage to that of the first reference voltage if it becomes lower than the level of the first reference voltage; and the second internal voltage generation means may include: second current mirror amplification means for comparing the second (or third) internal voltage with the first (or second) reference voltage to obtain a difference therebetween and amplifying the obtained difference; and second pull-up means for raising the level of the second (or third) internal voltage to that of the first (or second) reference voltage if it becomes lower than the level of the first (or second) reference voltage.

In accordance with a further aspect of the present invention, there is provided an internal voltage generation circuit of a semiconductor memory device comprising: reference voltage generation means for generating a first reference voltage and a second reference voltage as control signals for internal voltage supply, first internal voltage generation means for generating a first internal voltage of a desired level in response to the first reference voltage from the reference voltage generation means; internal voltage transfer means responsive to an enable signal resulting from a logical operation of an active control signal indicative of an active mode and a refresh control signal indicative of a refresh mode for, when the memory device is in the active mode, receiving the first internal voltage from an output terminal of the first internal voltage generation means and outputting a second internal voltage of the same level as that of the first internal voltage to an output terminal of second internal voltage generation means; and the second internal voltage generation means responsive to the enable signal and the second reference voltage from the reference voltage generation means for generating a third internal voltage of a level lower than that of the first internal voltage when the memory device is in any other mode including the refresh mode.

Preferably, the first internal voltage is supplied to a row path & control logic in the memory device and the second and third internal voltages are supplied to a column path & control logic and a data path & control logic in the memory device.

Preferably, the first internal voltage generation means includes: current mirror amplification means for comparing the first internal voltage with the first reference voltage to obtain a difference therebetween and amplifying the obtained difference; and pull-up means for raising the level of the first internal voltage to that of the first reference voltage if it becomes lower than the level of the first reference voltage.

Preferably, the second internal voltage generation means includes: current mirror amplification means responsive to the enable signal for, only when the memory device is in any other mode including the refresh mode, comparing the third internal voltage with the second reference voltage to obtain a difference therebetween and amplifying the obtained difference; and pull-up means for raising the level of the third internal voltage to that of the second reference voltage if it becomes lower than the level of the second reference voltage.

The first internal voltage generation means may include: first current mirror amplification means for comparing the first internal voltage with the first reference voltage to obtain a difference therebetween and amplifying the obtained difference; and first pull-up means for raising the level of the first internal voltage to that of the first reference voltage if it becomes lower than the level of the first reference voltage; and the second internal voltage generation means may include: second current mirror amplification means responsive to the enable signal for, only when the memory device is in any other mode including the refresh mode, comparing the third internal voltage with the second reference voltage to obtain a difference therebetween and amplifying the obtained difference; and second pull-up means for raising the level of the third internal voltage to that of the second reference voltage if it becomes lower than the level of the second reference voltage.

In accordance with yet another aspect of the present invention, there is provided an internal voltage generation circuit of a semiconductor memory device comprising: internal voltage generation means for supplying a first internal voltage of a desired level to a row path & control logic; and internal voltage transfer means for receiving the first internal voltage from the internal voltage generation means and, in response to an enable signal resulting from a logical operation of an active control signal indicative of an active mode and a refresh control signal indicative of a refresh mode, supplying a second internal voltage of the same level as that of the first internal voltage to a column path & control logic and a data path & control logic when the memory device is in the active mode and a third internal voltage of a level lower than that of the first internal voltage to the column path & control logic and data path & control logic when the memory device is in any other mode including the refresh mode, wherein the internal voltage transfer means includes: a MOS transistor for supplying the second internal voltage of the same level as that of the first internal voltage in response to the enable signal; and a MOS diode for dropping the first internal voltage by a predetermined threshold voltage thereof and supplying the resulting voltage as the third internal voltage.

Preferably, the MOS transistor is a PMOS (P-channel Metal-Aide Semiconductor) transistor, which is turned on when the active control signal goes high in level and the refresh control signal goes low in level.

The MOS diode may be an NMOS (N-channel Metal-Oxide Semiconductor) diode.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
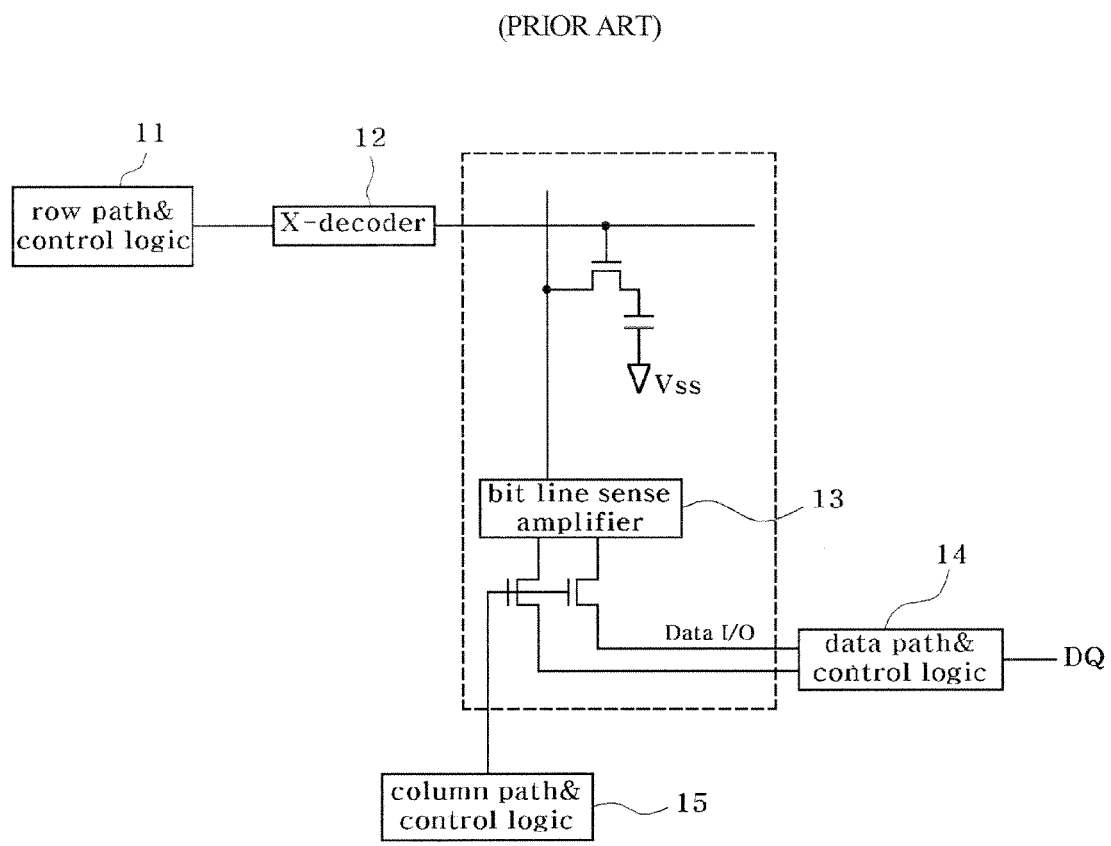
FIG. 1 is a general conceptual diagram of a semiconductor memory device.
Figure 2:
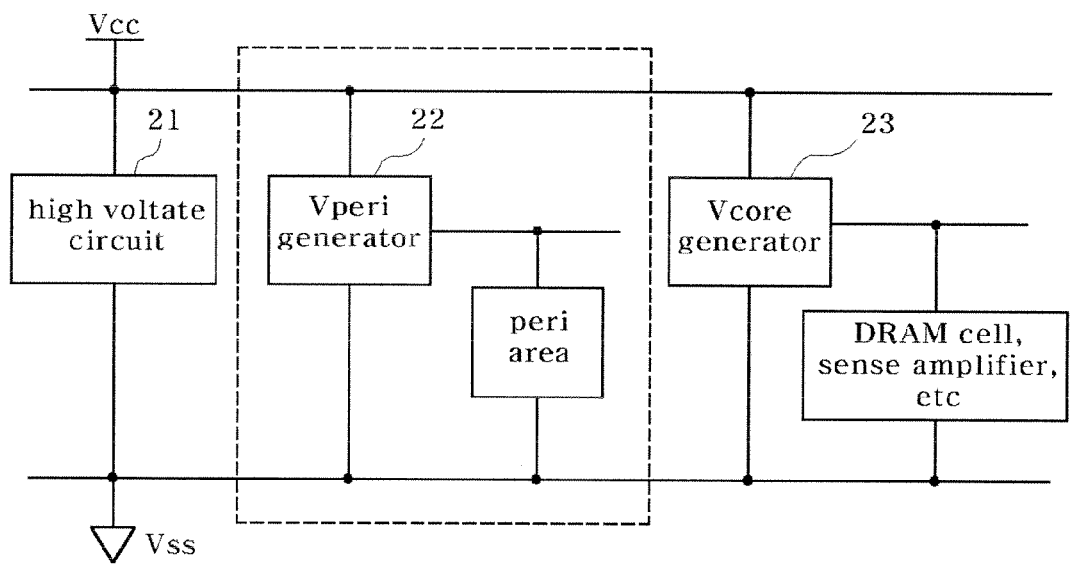
FIG. 2 is a conceptual diagram of an internal voltage generation circuit of a conventional semiconductor memory device.
Figure 3:
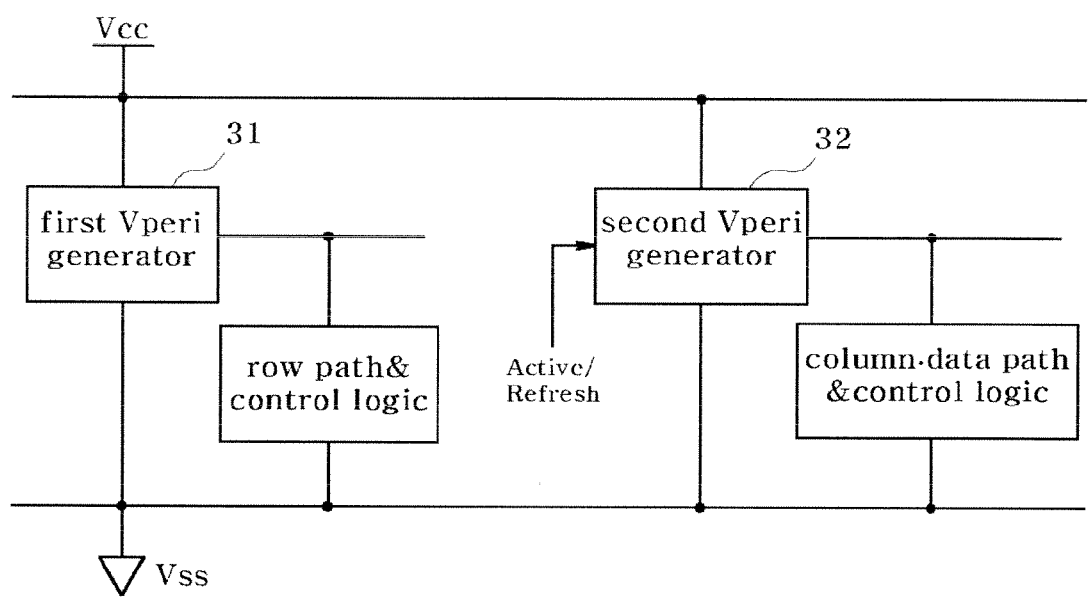
FIG. 3 is a conceptual diagram of an internal voltage generation circuit of a semiconductor memory device according to the present invention.

FIG. 3 is a conceptual diagram of an internal voltage generation circuit of a semiconductor memory device according to the present invention. As shown in this drawing, the internal voltage generation circuit according to the present invention comprises a first Vperi generator 31 for generating an internal voltage Vperi_1 to a row path & control logic in response to an external voltage Vcc applied thereto. The internal voltage Vperi_1 from the first Vperi generator 31 is always applied to the row path & control logic since an operating voltage is always necessary therefor. The internal voltage generation circuit according to the present invention further comprises a second Vperi generator 32 for generating an internal voltage to a column path & control logic and a data path & control logic in response to the external voltage Vcc applied thereto. The column path & control logic and the data path & control logic are selectively applied with the internal voltage from the second Vperi generator 32 since whether they are involved in the current operation mode of the memory device or not is determined according to the operation mode.

Preferably, the second Vperi generator 32 determines the level of its output voltage in response to an active control signal Active and a refresh control signal Refresh inputted thereto. That is, where the memory device is in an active mode, the second Vperi generator 32 outputs an internal voltage Vperi_2 of the same level as that of the internal voltage Vperi_1. However, in the case where the memory device is in a standby mode including a refresh mode in which the column path & control logic and the data path & control logic are not involved in the operation of the memory device, the second Vperi generator 32 outputs an internal voltage Vperi_3 of a level lower than that of the internal voltage Vperi_1.

Figure 4A:
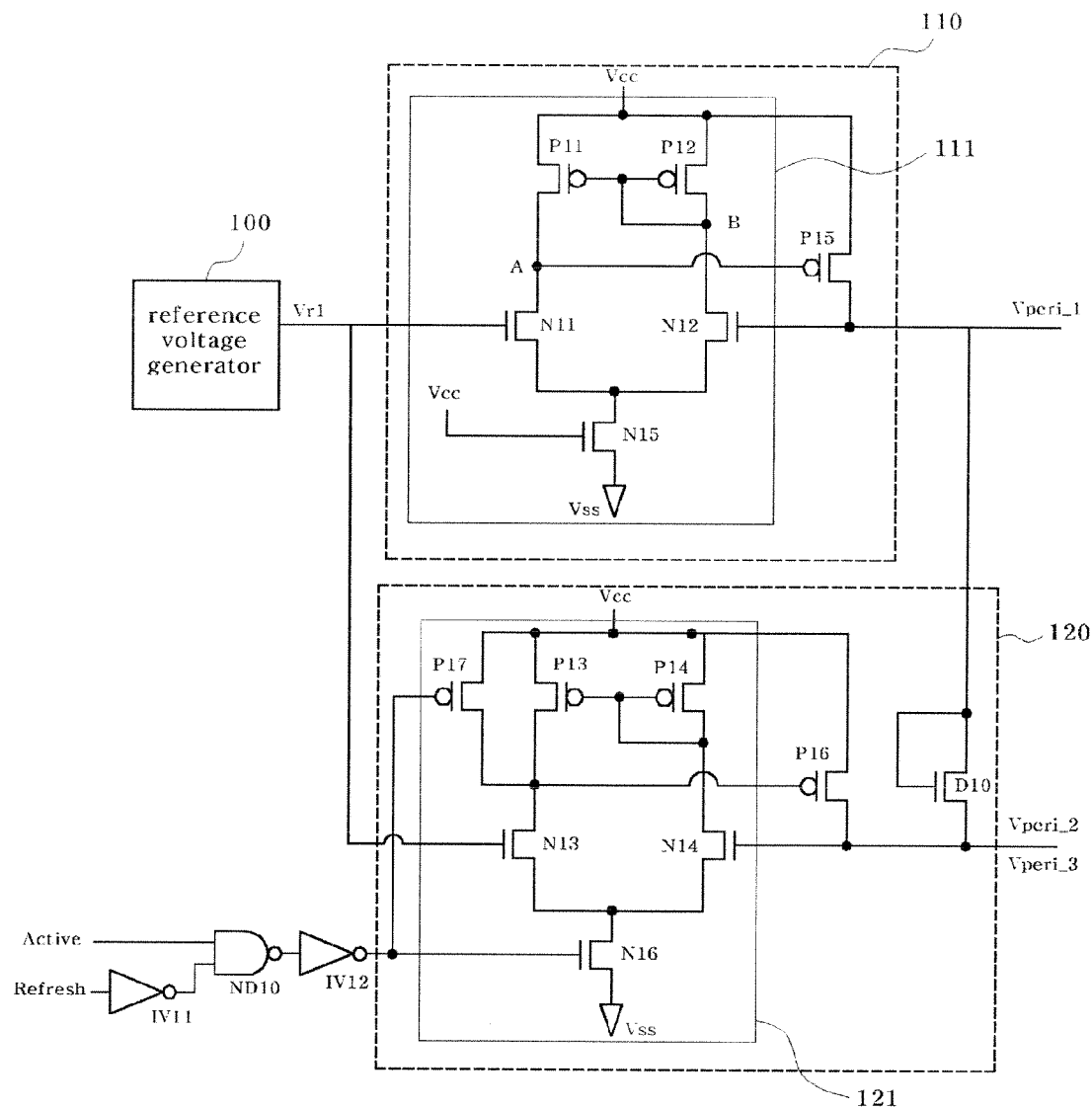
FIG. 4A is a circuit diagram showing the configuration of a first embodiment of the internal voltage generation circuit of the semiconductor memory device according to the present invention.

FIG. 4A is a circuit diagram showing the configuration of a first embodiment of the internal voltage generation circuit of the semiconductor memory device according to the present invention. As show in this drawing, the internal voltage generation circuit according to the first embodiment comprises a reference voltage generator 100 for generating a reference voltage Vr1 to be used as a control signal for internal voltage supply, a first Vperi generator 110 for generating an internal voltage Vperi_1 of a constant level in response to the reference voltage Vr1 from the reference voltage generator 100, and a second Vperi generator 120 responsive to an enable signal resulting from a logical operation of an active control signal Active indicative of an active mode and a refresh control signal Refresh indicative of a refresh mode and the reference voltage Vr1 from the reference voltage generator 100, for generating an internal voltage Vperi_2 of the same level as that of the internal voltage Vperi_1 when the memory device is in the active mode and an internal voltage Vperi_3 of a level lower by a predetermined value than that of the internal voltage Vperi_1 when the memory device is in any other mode including the refresh mode.

A detailed description will hereinafter be given of the operation of the internal voltage generation circuit with the above-stated configuration according to the first embodiment.

First, the reference voltage Vr1 for the internal voltage Vperi_1 is generated by the reference voltage generator 100 and applied to a gate of an NMOS (N-channel Metal-Oxide Semiconductor) transistor N11 of a first current mirror amplifier 111 in the first Vperi generator 110. At this time, since an NMOS transistor N15 is always applied with an external voltage Vcc at its gate, it is always kept ON, thereby allowing the first current mirror amplifier 111 to be always operated. As a result, the internal voltage Vperi_1 of the constant level is outputted at a gate of an NMOS transistor N12, or an output terminal of the first Vperi generator 110, according to the reference voltage Vr1. This internal voltage Vperi_1 is applied as a high voltage source to a row path & control logic.

The first current mirror amplifier 111 is operated in the following manner. If the reference voltage Vr1 is applied to the gate of the NMOS transistor N11 under the condition that the NMOS transistor N15 remains ON, then the internal voltage Vperi_1 of the constant level is outputted at the gate of the NMOS transistor N12. At this time, if the internal voltage Vperi_1 becomes lower in level than the reference voltage Vr1, a node B becomes relatively higher in voltage level than a node A. In this case, because two PMOS (P-channel Metal-Oxide Semiconductor) transistors P11 and P12 are connected in common to the node B at their gates, they increase in resistance, thereby causing the voltage level at the node A to become lower than the previous one. As a result, a PMOS transistor P15 becomes lower in gate voltage level, thereby causing a larger amount of current to flow from the external voltage Vcc so as to raise the level of the internal voltage Vperi_1. On the contrary, if the internal voltage Vperi_1 becomes higher in level than the reference voltage Vr1, the node B becomes relatively lower in voltage level than the node A. In this case, the two PMOS transistors P11 and P12 decrease in resistance, so the voltage level at the node A becomes higher than the previous one. As a result, the PMOS transistor P15 becomes higher in gate voltage level, thereby causing a smaller amount of current to flow from the external voltage Vcc, which leads to a reduction in the level of the internal voltage Vperi_1. Consequently, the internal voltage Vperi_1 of the constant level is generated and outputted at the output terminal of the first Vperi generator 110.

On the other hand, the second Vperi generator 120 includes a second current mirror amplifier 121 designed in such a manner that a PMOS transistor P17 and an NMOS transistor N16 thereof are controlled by a control signal from an inverter IV12. The active control signal Active goes high in level in a red/write mode or the refresh mode to select one word line in the memory device. The refresh control signal Refresh goes high in level when the refresh mode is executed in response to an auto-refresh command, a self-refresh command or an external command.

As shown in FIG. 4A, an inverted version of the refresh control signal Refresh and the active control signal Active are inputted to the input of a NAND gate ND10. The NAND gate ND10 outputs a low-level signal when the inputted signals are both high in level. In this regard, only when the memory device is in the active mode, the output of the NAND gate ND10 is kept low in level. As a result, only when the memory device is in the active mode, the output of the inverter IV12 goes high in level to turn the PMOS transistor P17 on and the NMOS transistor N16 off, thereby allowing the second current mirror amplifier 121 to be normally operated. Consequently, in this case, the second current mirror amplifier 121 is operated in the same manner as the first current mirror amplifier 111 to output the internal voltage Vperi_2 of the same level as that of the internal voltage Vperi_1 at an output terminal of the second Vperi generator 120. This internal voltage Vperi_2 is supplied to a column path & control logic and a data path & control logic.

On the other hand, in the case where the memory device is in any other mode including the refresh mode, for example, a standby mode, the output of the inverter IV12 goes low in level to turn the PMOS transistor P17 on and the NMOS transistor N16 off, so the second current mirror amplifier 121 is not operated. However, the internal voltage Vperi_1 generated by the first Vperi generator 110 is inputted to a MOS (Metal-Oxide Semiconductor) diode D10 so that the internal voltage Vperi_3 can be outputted at the output terminal of the second Vperi generator 120. Namely, the internal voltage Vperi_1 is inputted to the MOS diode D10 and then outputted as the internal voltage Vperi_3. At this time, the internal voltage Vperi_3 has a level lower by a threshold voltage Vt of the MOS diode D10 than that of the internal voltage Vperi_1 inputted to the MOS diode D10. Accordingly, by adjusting the threshold voltage Vt of the diode D10, an internal voltage Vperi_3 of a desired level can be generated and supplied to the column path & control logic and the data path & control logic in the standby mode.

In brief, the internal voltage generation circuit according to the first embodiment as described above always supplies an internal voltage Vperi_1 of a constant level to the row path & control logic, and supplies an internal voltage Vperi_2 of the same level as that of the internal voltage Vperi_1 to the column path & control logic and the data path & control logic when the memory device is in the active mode and an internal voltage Vperi_3 of a level lower by a predetermined threshold voltage Vt than that of the internal voltage Vperi_1 to the column path & control logic and the data path & control logic when the memory device is in the standby mode including the refresh mode. Therefore, the internal voltage generation circuit according to the first embodiment can reduce unnecessary current leakage and power consumption of the memory device by adjusting the supply level of a specific internal voltage according to the operation mode of the memory device.

Figure 4B:
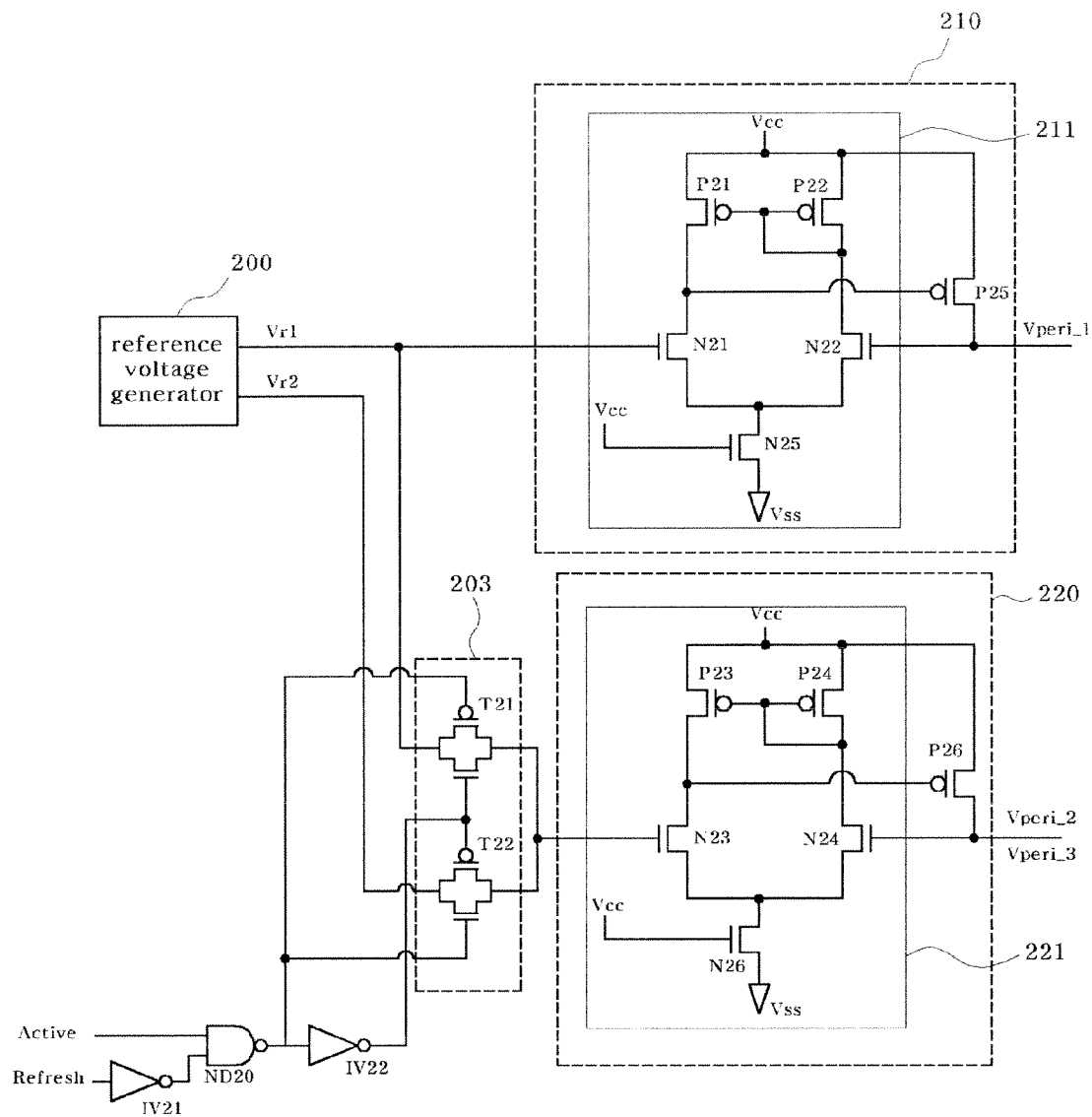
FIG. 4B is a circuit diagram showing the configuration of a second embodiment of the internal voltage generation circuit of the semiconductor memory device according to the present invention.

FIG. 4B is a circuit diagram showing the configuration of a second embodiment of the internal voltage generation circuit of the semiconductor memory device according to the present invention. As shown in this drawing, the internal voltage generation circuit according to the second embodiment comprises a reference voltage generator 200 for generating a reference voltage Vr1 and a reference voltage Vr2 to be used as control signals for internal voltage supply, a first Vperi generator 210 for generating an internal voltage Vperi_1 of a constant level in response to the reference voltage Vr1 from the reference voltage generator 200, a reference voltage transfer circuit 203 responsive to an enable signal resulting from a logical operation of an active control signal Active and a refresh control signal Refresh and the reference voltages Vr1 and Vr2 from the reference voltage generator 200, for transferring the reference voltage Vr1 when the memory device is in an active mode and the reference voltage Vr2 when the memory device is in any other mode including a refresh mode, and a second Vperi generator 220 responsive to an output voltage from the reference voltage transfer circuit 203 for generating an internal voltage Vperi_2 of the same level as that of the internal voltage Vperi_1 if the output voltage is the reference voltage Vr1 and an internal voltage Vperi_3 of a level lower by a predetermined value than that of the internal voltage Vperi_1 if the output voltage is the reference voltage Vr2. Here, the active control signal Active and the refresh control signal Refresh are the same as those used in the first embodiment.

A detailed description will hereinafter be given of the operation of the internal voltage generation circuit with the above-stated configuration according to the second embodiment First the reference voltage Vr1 for the internal voltage Vperi_1 is generated by the reference voltage generator 200 and applied to a gate of an NMOS transistor N21 of a first current mirror amplifier 211 in the first Vperi generator 210. Then, the first current mirror amplifier 211 is operated in the same manner as the first current miner amplifier 111 in the first embodiment to output the internal voltage Vperi_1 of the constant level at an output terminal of the first Vperi generator 210 according to the reference voltage Vr1. This internal voltage Vperi_1 is applied as a high voltage source to a row path & control logic.

On the other hand, the second Vperi generator 220 includes a second current mirror amplifier 221 designed in such a manner that it is controlled by the active control signal Active and refresh control signal Refresh applied to the reference voltage transfer circuit 203, in order to supply a specific internal voltage to a column path & control logic and a data path & control logic. That is, since an NMOS transistor N26 is always applied with an external voltage Vcc at its gate, it is always kept ON, thereby allowing the second current mirror amplifier 221 to be always operated. However, a voltage to a gate of an NMOS transistor N23 is controlled by the active control signal Active and the refresh control signal Refresh.

In a similar manner to in the first embodiment, only when the memory device is in the active mode, the output of a NAND gate ND20 goes low in level and the output of an inverter IV22 thus goes high in level. In this case, a transfer gate T21 is turned on and a transfer gate T22 is turned off, thereby causing the reference voltage Vr1 to be applied to the gate of the NMOS transistor N23. As a result, the second current minor amplifier 221 is operated in the same manner as the first current mirror amplifier 211 to output the internal voltage Vperi_2 of the same level as that of the internal voltage Vperi_1 at an output terminal of the second Vperi generator 220. This internal voltage Vperi_2 is supplied to the column path & control logic and the data path & control logic.

On the other hand, in the case where the memory device is in any other mode including the refresh mode, for example, a standby mode, the output of the NAND gate ND20 goes high in level and the output of the inverter IV22 thus goes low in level. In this case, the transfer gate T21 is turned off and the transfer gate T22 is turned on, thereby causing the reference voltage Vr2 to be applied to the gate of the NMOS transistor N23. As a result, the second current minor amplifier 221 is operated to output the internal voltage Vperi_3 of the level lower by the predetermined value than that of the internal voltage Vperi_1 at the output terminal of the second Vperi generator 220 according to the reference voltage Vr2. This internal voltage Vperi_3 is supplied to the column path & control logic and the data path & control logic.

In brief, similarly to the first embodiment, the internal voltage generation circuit according to the second embodiment as described above can reduce unnecessary current leakage and power consumption of the memory device by adjusting the supply level of a specific internal voltage according to the operation mode of the memory device.

Figure 4C:
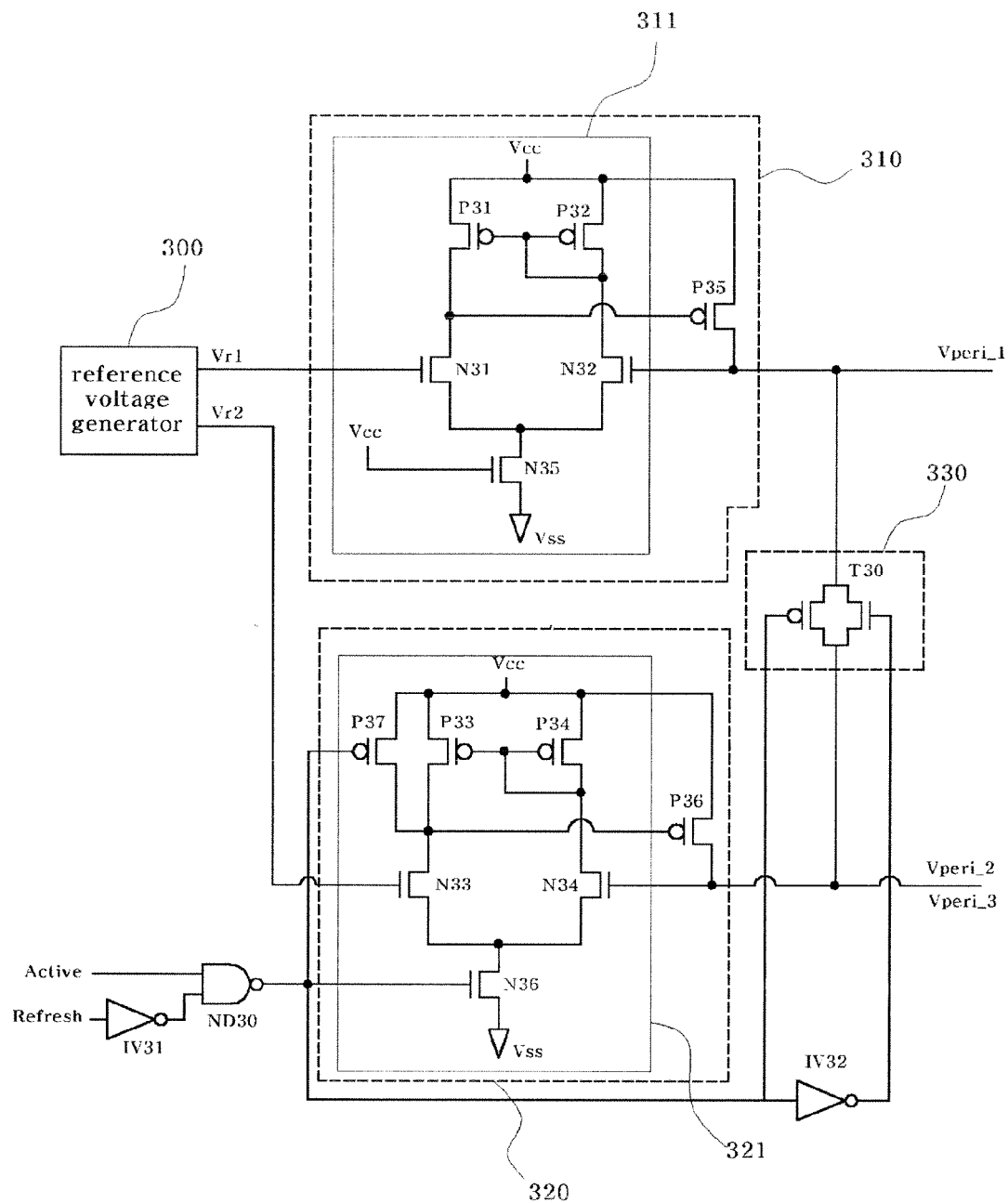
FIG. 4C is a circuit diagram showing the configuration of a third embodiment of the internal voltage generation circuit of the semiconductor memory device according to the present invention.

FIG. 4C is a circuit diagram showing the configuration of a third embodiment of the internal voltage generation circuit of the semiconductor memory device according to the present invention. As shown in this drawing, the internal voltage generation circuit according to the third embodiment comprises a reference voltage generator 300 for generating a reference voltage Vr1 and a reference voltage Vr2 to be used as control signals for internal voltage supply, a first Vperi generator 310 for generating an internal voltage Vperi_1 of a constant level in response to the reference voltage Vr1 from the reference voltage generator 300, and an internal voltage transfer circuit 330 responsive to an enable signal resulting from a logical operation of an active control signal Active and a refresh control signal Refresh for, when the memory device is in an active mode, receiving the internal voltage Vperi_1 from an output terminal of the first Vperi generator 310 and outputting an internal voltage Vperi_2 of the same level as that of the internal voltage Vperi_1 to an output terminal of a second Vperi generator 320. The second Vperi generator 320 is responsive to the enable signal and the reference voltage Vr2 from the reference voltage generator 300 to generate an internal voltage Vperi_3 of a level lower by a predetermined value than that of the internal voltage Vperi_1 when the memory device is in any other mode including a refresh mode. Here, the active control signal Active and the refresh control signal Refresh are the same as those used in the first embodiment.

A detailed description will hereinafter be given of the operation of the internal voltage generation circuit with the above-stated configuration according to the third embodiment. First, the reference voltage Vr1 for the internal voltage Vperi_1 is generated by the reference voltage generator 300 and applied to a gate of an NMOS transistor N31 of a first current mirror amplifier 311 in the first Vperi generator 310. Then, the first current mirror amplifier 311 is operated in the same manner as the first current mirror amplifier 11 in the first embodiment to output the internal voltage Vperi_1 of the constant level at the output terminal of the first Vperi generator 310 according to the reference voltage Vr1. This internal voltage Vperi_1 is applied as a high voltage source to a row path & control logic.

On the other hand, in order to supply a specific internal voltage to a column path & control logic and a data path & control logic, a second current mirror amplifier 321 in the second Vperi generator 320 and the internal voltage transfer circuit 330 are controlled by the active control signal Active and refresh control signal Refresh which are the same as those in the first embodiment. Namely, only when the memory device is in the active mode, the output of a NAND gate ND30 goes low in level. In this case, a PMOS transistor P37 is turned on and an NMOS transistor N36 is turned off, so the second current mirror amplifier 321 is not operated. However, a transfer gate T30 of the internal voltage transfer circuit 330 is turned on to output the internal voltage Vperi_2 of the same level as that of the internal voltage Vperi_1 at the output terminal of the second Vperi generator 320. This internal voltage Vperi_2 is supplied to the column path & control logic and the data path & control logic.

On the other hand, when the memory device is in any other mode including the refresh mode, for example, a standby mode, the output of the NAND gate ND20 goes high in level. In this case, the transfer gate T31 is turned off, the PMOS transistor P37 is turned off and the NMOS transistor N36 is tuned on, so the second current mirror amplifier 321 is normally operated. As a result, since the reference voltage Vr2 is applied to a gate of an NMOS transistor N33, the second current mirror amplifier 221 is operated to output the internal voltage Vperi_3 of the level lower by the predetermined value than that of the internal voltage Vperi_1 at the output terminal of the second Vperi generator 220 according to the reference voltage Vr2. This internal voltage Vperi_3 is supplied to the column path & control logic and the data path & control logic.

Therefore, similarly to the first and second embodiments, the internal voltage generation circuit according to the third embodiment as described above can reduce unnecessary current leakage and power consumption of the memory device by adjusting the supply level of a specific internal voltage according to the operation mode of the memory device.

Figure 5:
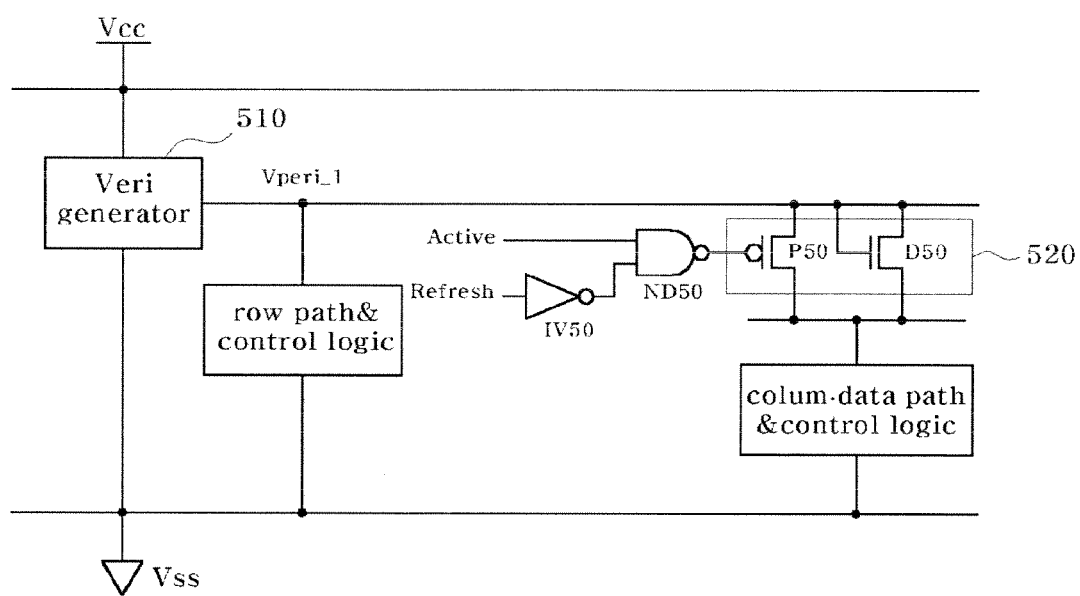
FIG. 5 is a circuit diagram showing the configuration of a fourth embodiment of the internal voltage generation circuit of the semiconductor memory device according to the present invention.

FIG. 5 is a circuit diagram showing the configuration of a fourth embodiment of the internal voltage generation circuit of the semiconductor memory device according to the present invention. As shown in this drawing, the internal voltage generation circuit according to the fourth embodiment comprises a Vperi generator 510 for supplying an internal voltage Vperi_1 of a constant level to a row path & control logic, and an internal voltage transfer circuit 520 for receiving the internal voltage Vperi_1 from the Vperi generator 510 and, in response to an enable signal resulting from a logical operation of an active control sign Active and a refresh control signal Refresh, supplying an internal voltage Vperi_2 of the same level as that of the internal voltage Vperi_1 to a column path & control logic and a data path & control logic when the memory device is in an active mode and an internal voltage Vperi_3 of a level lower by a predetermined value than that of the internal voltage Vperi_1 to the column path & control logic and data path & control logic when the memory device is in any other mode including a refresh mode. The internal voltage transfer circuit 520 includes a PMOS transistor P50 for supplying the internal voltage Vperi_2 in response to the enable signal, and a MOS diode D50 for dropping the internal voltage Vperi_1 by a predetermined threshold voltage Vt thereof and supplying the resulting voltage as the internal voltage Vperi_3. Here, the active control signal Active and the refresh control signal Refresh are the same as those used in the first embodiment.

A detailed description will hereinafter be given of the operation of the internal voltage generation circuit with the above-stated configuration according to the fourth embodiment. As shown in FIG. 5, in a different manner firm the first to third embodiments, the fourth embodiment employs only one internal voltage generator, or the Vperi generator 510.

First, the internal voltage Vperi_1 is supplied as a high voltage source to the row path & control logic that must be applied with a constant operating voltage irrespective of the operation mode of the memory device. On the other hand, when the memory device is in the active mode, the active control signal Active goes high in level and the refresh control signal Refresh goes low in level, thereby causing the output of a NAND gate ND50 to become low in level. As a result, the PMOS transistor P50 is turned on to supply the internal voltage Vperi_2 of the same level as that of the internal voltage Vperi_1 to the column path & control logic and the data path & control logic. On the contrary, when the memory device is in any other mode including the refresh mode, for example, a standby mode, the output of the NAND gate ND50 becomes high in level and the PMOS transistor P50 is thus turned off. As a result, the internal voltage Vperi_3 of the level that is lower by the threshold voltage Vt of the MOS diode D50 than that of the internal voltage Vperi_1 is supplied to the column path & control logic and the data path & control logic.

Therefore, through the use of only one internal voltage generator, the internal voltage generation circuit according to the fourth embodiment as described above can reduce unnecessary current leakage and power consumption of the memory device by adjusting the supply level of a specific internal voltage according to the operation mode of the memory device, similarly to the first to third embodiments.

As apparent from the above description, the present invention provides an internal voltage generation circuit of a semiconductor memory device which is capable of supplying voltages of different levels to a column path & control logic and data path & control logic in the memory device according to different operation modes of the memory device. The column path & control logic and data path & control logic are applied with a normal operating voltage when they are involved in the current operation mode of the memory device, whereas with a lower voltage when they are not involved. Therefore, the present invention has the effect of efficiently managing internal voltages of the semiconductor memory device and reducing current leakage of the memory device and, in turn unnecessary power consumption thereof.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   reference voltage generation means for generating a first reference voltage and a second reference voltage as control signals for internal voltage supply;
   first internal voltage generation means for generating a first internal voltage of a desired level in response to said first reference voltage from said reference voltage generation means;
   enable signal generation means for generating an enable signal by performing a logical operation in response to an active control signal indicative of an active mode and a refresh control signal indicative of a refresh mode;
   reference voltage transfer means responsive to the enable signal resulting from the logical operation of the active control signal indicative of the active mode and the refresh control signal indicative of the refresh mode and said first and second reference voltages from said reference voltage generation means, for transferring said first reference voltage when said memory device is in said active mode and said second reference voltage when said memory device is in any other mode including said refresh mode;
   second internal voltage generation means responsive to an output voltage from said reference voltage transfer means for generating a second internal voltage of the same level as that of said first internal voltage if the output voltage is said first reference voltage and a third internal voltage of a level lower than that of said first internal voltage if the output voltage is said second reference voltage;
   a row path and control logic supplied to said first internal voltage; and
   a column path and control logic and a data path and control logic supplied to said second internal voltage in said active mode, said third internal voltage in said refresh mode.

2. A semiconductor memory device as set forth in claim 1, wherein said first internal voltage generation means includes:
   current mirror amplification means for comparing said first internal voltage with said first reference voltage to obtain a difference therebetween and amplifying the obtained difference; and
   pull-up means for raising the level of said first internal voltage to that of said first reference voltage if it becomes lower than the level of said first reference voltage.

3. A semiconductor memory device as set forth in claim 1, wherein said second internal voltage generation means includes:

current mirror amplification means for comparing said second or third internal voltage with said first or second reference voltage to obtain a difference therebetween and amplifying the obtained difference; and pull-up means for raising the level of said second or third internal voltage to that of said first or second reference voltage if it becomes lower than the level of said first or second reference voltage.

4. A semiconductor memory device as set forth in claim 1, wherein:

said first internal voltage generation means includes:

first current mirror amplification means for comparing said first internal voltage with said first reference voltage to obtain a difference therebetween and amplifying the obtained difference; and first pull-up means for raising the level of said first internal voltage to that of said first reference voltage if it becomes lower than the level of said first reference voltage; and said second internal voltage generation means includes:

second current mirror amplification means for comparing said second or third internal voltage with said first or second reference voltage to obtain a difference therebetween and amplifying the obtained difference; and second pull-up means for raising the level of said second or third internal voltage to that of said first or second reference voltage if it becomes lower than the level of said first or second reference voltage.

* * * * *